United States Patent
Nagai et al.

(10) Patent No.: US 8,174,118 B2
(45) Date of Patent: May 8, 2012

(54) DETECTION DEVICE AND METHOD FOR MANUFACTURING THE SAME

(75) Inventors: Youichi Nagai, Osaka (JP); Hiroshi Inada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 216 days.

(21) Appl. No.: 12/651,633

(22) Filed: Jan. 4, 2010

(65) Prior Publication Data

US 2010/0171097 A1    Jul. 8, 2010

(30) Foreign Application Priority Data

Jan. 5, 2009 (JP) ................................. 2009-000378

(51) Int. Cl.
*H01L 23/48* (2006.01)

(52) U.S. Cl. . 257/737; 257/740; 257/777; 257/E21.508; 257/E23.068

(58) Field of Classification Search .......................... None
See application file for complete search history.

(56) References Cited

U.S. PATENT DOCUMENTS

| | | | |
|---|---|---|---|
| 2002/0100972 A1* | 8/2002 | Kitajima et al. | 257/734 |
| 2010/0072457 A1* | 3/2010 | Iguchi et al. | 257/21 |

FOREIGN PATENT DOCUMENTS

| | | | | |
|---|---|---|---|---|
| JP | 05-136147 | A | | 6/1993 |
| JP | 07-038076 | A | | 2/1995 |
| JP | 07038076 | A | * | 2/1995 |
| JP | 07-153905 | A | | 6/1995 |
| JP | 07153905 | A | * | 6/1995 |
| JP | 2002-299650 | A | | 10/2002 |

* cited by examiner

*Primary Examiner* — Evan Pert
*Assistant Examiner* — Scott R Wilson
(74) *Attorney, Agent, or Firm* — Venable LLP; Michael A. Sartori; Leigh D. Thelen

(57) ABSTRACT

A method for manufacturing a detection device includes the steps of providing bonding bumps on at least one of a light-receiving element array and a read-out circuit multiplexer, fixing a bump height adjusting member for adjusting the heights of the bumps to the light-receiving element array and/or the read-out circuit multiplexer on which the bumps are provided, and pressing a flat plate on the tops of the bumps and deforming the bumps until the flat plate comes in contact with the end of the bump height adjusting member.

12 Claims, 16 Drawing Sheets

(a)

(b)

(a) Dark-state image
· Defect (short-curcuit) is shown in white (b) Light-state image
· Defect (open) is shown in black (a) Dark-state image
· Defect (short-curcuit) is shown in white (b) Light-state image
· Defect (open) is shown in black

DETECTION DEVICE AND METHOD FOR MANUFACTURING THE SAME

BACKGROUND OF THE INVENTION

1. Field of the Invention

The present invention relates to a detection device having photosensitivity in a near infrared wavelength range and a method for manufacturing the detection device.

2. Description of the Related Art

In a detection device including a photodiode array in which photodiodes are arranged, read-out electrodes of signal read-out silicon IC (ROIC: Read Out IC) face electrodes of the arranged photodiodes, and electric conduction is made by bumps provided between the two types of electrodes. In a near infrared range or infrared range on the longer wavelength side than a visible range, the photodiodes are formed using a compound semiconductor. Therefore, such a configuration may be referred to as a "hybrid configuration" including a compound semiconductor and silicon (IC). Crystals of the compound semiconductor are weak against mechanical force, and thus indium (In) which is soft and has a low melting point is frequently used for bumps when the hybrid configuration is formed.

Indium bumps are easily deformed and made nonuniform due to the above-described property when provided on photodiode electrodes or ROIC read-out electrodes. For example, the indium bumps do not have a uniform cylindrical column shape but frequently have a shape which has a burr projecting along the edge of the top or a shape which is broken on one of the sides to be deformed into a frustum. Although several tens of thousands to several hundreds of thousands of bumps are provided on a detection device, bumps having large shape deviation are necessarily produced. In pressure bonding or brazing and welding, one-to-one conduction is not realized with bumps having large shape deviation, and such bumps easily project from the regions of the bumps (corresponding pixel regions) and contact adjacent bumps or do not realize one-to-one conduction. Such defective pixels become white spots on a black-background screen, and disconnected pixels become black spots on a white-background screen. The defective pixels cause undesirable imaging or cause deterioration of resolution in material detection or inspection, thereby decreasing the commercial value of a detection device.

In order to resolve the above-mentioned problem, many proposals have been made. In order to control the shapes of In bumps to be uniform in the hybrid configuration, there has been proposed (d1) a method of making it easy to control In bump shapes to be uniform by heat melting an evaporated film of In whose melting point decreased by alloying during lift-off, (Japanese Unexamined Patent Application Publication No. 5-136147). Also there has been proposed (d2) a method of providing an engagement structure using irregular portions between a compound semiconductor substrate and a silicon substrate in order to prevent lateral deviation during bonding of bumps in a hybrid configuration (Japanese Unexamined Patent Application Publication No. 7-38076). Further there has been proposed (d3) a method of incorporating a gap adjusting member for providing an appropriate gap in the vertical direction (thickness direction), thereby preventing defective bonding of bumps during bump bonding (Japanese Unexamined Patent Application Publication No. 2002-299650). Further there has been proposed (d4) a method of placing bumps in holes in a reticular-pattern member composed of an insulating resin so that the bumps are surrounded by a non-hole portion and are isolated from adjacent bumps (Japanese Unexamined Patent Application Publication No. 7-153905).

The above-described improvement methods (d1) to (d4) have the following problems.

(d1)(i) The application is limited. In this method, the melting point of 160° C. of In is further decreased, and thus the bumps having the decreased melting point cannot resist the heat generated by IC, summer atmospheric temperature, and the like. Therefore, the application is limited to infrared sensors used by cooling, such as MCT (Mercury Cadmium Telluride (HgCdTe)). In addition, from the viewpoint of preventing re-melting of bumps which causes short-circuiting between pixels, it is necessary to select a material with a lower melting point as a die bonding material for mounting the resultant hybrid configuration on a package and as a joint material used for jointing a lid to the package and sealing it, thereby significantly decreasing the number of options. (ii) When In is evaporated, the amount of In evaporated varies with positions, and thus it is difficult to control the heights of In bumps to be uniform. For example, even when In bumps are formed on both a photodiode and ROIC in order to absorb variation of height, the tops of the In bumps slip during bonding because the tops are not flat. This may cause short-circuiting between pixels.

(d2) The cost is increased. In order to form an irregularity engagement structure, it is necessary to form a mask pattern on both a compound semiconductor substrate and a silicon substrate and perform dry etching. Therefore, the number of steps is increased.

(d3) The bonding yield is decreased. During bonding with In bumps having variations in height and shape, bonding variation occurs in an early stage of bonding.

(d4) The bonding yield is decreased. Although short-circuiting due to lateral deviation can be prevented by the non-hole portion of the reticular pattern, short-circuiting due to overflow, which is caused by variation in height, or disconnection in a portion having an insufficient height cannot be suppressed.

SUMMARY OF THE INVENTION

Accordingly, it is an object of the present invention to provide a detection device excellent in economy and capable of achieving a high manufacturing yield while decreasing a ratio of defective pixels, and a method for manufacturing the detection device.

A method for manufacturing a detection device according to the present invention is a method for manufacturing a detection device including a light-receiving element array formed on a compound semiconductor multilayer and a read-out circuit which is formed on silicon and which reads out photocurrent from the light-receiving element array. The manufacturing method includes the steps of providing bonding bumps on electrodes of at least one of the light-receiving element array and the read-out circuit, fixing a bump height adjusting member for adjusting the heights of the bumps to the light-receiving element array and/or the read-out circuit on which the bumps are provided, and pressing a flat plate on the tops of the bumps and deforming the bumps until the flat plate comes in contact with the end of the bump height adjusting member.

According to the above-described method, the heights of the bumps are adjusted before the light-receiving element array and the read-out circuit are bonded together with the bumps provided therebetween, thereby decreasing the rate of short-circuiting between adjacent pixels or the like during the bonding. Also, the end surfaces of the bumps before bonding can be flattened. Therefore, slippage in bonding to the opposite member (the electrodes or bumps on the opposite side) can be prevented, thereby decreasing the ratio of defective pixels while achieving high manufacturing yield. The method requires a press for deforming the bumps by pressing the flat plate on the bumps. However, an existing press can be used, and another large-scale apparatus is not required, thereby little increasing the number of steps and achieving excellent economy. In addition, it is unnecessary to decrease the melting point of the bump composition, and thus temperature control is not supposed to be made.

The bumps may be provided on one or both of the light-receiving element array and the read-out circuit. When the bumps are provided on only one side, the bump height adjusting member is fixed to only one side on which the bumps are provided. When the bumps are provided on both, the bump height adjusting member may be provided on only one side or two bump height adjusting members are prepared and provided on both. Even when the bumps are provided on both, usually, the bump height adjusting member is provided on only one side.

When the bump height is increased to increase the bump compression margin during bonding in order to absorb the influence of warpage and irregularity of silicon and the compound semiconductor, the bumps are provided on both. In this case, when the bumps are formed by evaporation or the like, the bump height can be more efficiently obtained by providing the bumps on both the light-receiving element array and the read-out circuit.

The term "one side", 'both", or "opposite side" is used for indicating the light-receiving element array and the read-out circuit, but what the term represents can be determined from the context on the basis of common knowledge. In addition, when the bumps are provided on one or both sides before the light-receiving element array and the read-out circuit are bonded together with the bumps provided therebetween, this is expressed by the term "provided" or "formed". As a term representing the bonding, the term "joining", "connection", or "pressure bonding" due to use of a load, or the like is used.

The method further includes the steps of fixing a gap adjusting member to the light-receiving element array and/or the read-out circuit in order to adjust the gap between the light-receiving element array and the read-out circuit, and bonding together the light-receiving element array electrodes and the read-out circuit electrodes with the deformed bumps provided therebetween. In the bonding step, the gap adjusting member can be brought in contact with (g1) the opposite side on which the gap adjusting member is not fixed, (g2) the bump height adjusting member fixed to the opposite side, or (g3) when the gap adjusting member includes a plurality of partial members, a partial member fixed to the opposite side. Consequently, when the light-receiving element array and the read-out circuit are bonded together, the gap between both can be appropriately set over the entire region, and short-circuiting between adjacent pixels due to projection of the bumps or the like can be prevented.

For example, in the bonding step, when the gap adjusting member is brought in contact with (g2) the bump height adjusting member, a taper surface is provided on each of the gap adjusting member and the bump height adjusting member so that the thickness decreases toward the top, and thus the taper surfaces can be brought in contact with each other. As a result, not only the function to adjust the dimension (thickness or gap) in the vertical direction but also the positioning function in the lateral direction can be achieved.

A detection device of the present invention includes a light-receiving element array formed on a compound semiconductor multilayer and a read-out circuit which is formed on silicon and which reads out photocurrent from the light-receiving element array. The device further includes bonding bumps interposed between electrodes of the light-receiving element array and read-out electrodes of the read-out circuit, and a bump height adjusting member fixed to at least one of the light-receiving element array and the read-out circuit and used for adjusting the heights of the bumps before bonding. The device is characterized in that the end of the bump height adjusting member separates from the body of the opposite side to which the bump height adjusting member is not fixed.

The above-described configuration can realize a detection device with a decreased rate of defective pixels while exhibiting high manufacturing yield. In addition, the melting point of the bumps need not be decreased, and thus temperature control is not supposed to be made. The expression "the body of the opposite side" represents a device portion for achieving the original function of the opposite side (the light-receiving element array or the read-out circuit), not including a gap adjusting member, which will be described below, and the bump height adjusting member.

In addition, the end of the bump height adjusting member separates from the body of the other to which the bump height adjusting member is not fixed. Therefore, when the light-receiving element array and the read-out circuit are pressure-bonded or brazed and welded together, the bumps can be slightly crushed and bonded by pressing with a slight load. Therefore, more secured bonding can be achieved.

The detection device further includes the gap adjusting member fixed to the light-receiving element array and/or the read-out circuit in order to adjust the gap between the light-receiving element array and the read-out circuit. The gap adjusting member can be brought in contact with (g1) the opposite side on which the gap adjusting member is not fixed, (g2) the bump height adjusting member fixed to the opposite side, or (g3) when the gap adjusting member includes a plurality of partial members, a partial member fixed to the opposite side. Consequently, the gap between the light-receiving element array and the read-out circuit can be appropriately set over the entire region. As a result, high manufacturing yield can be achieved by a simple mechanism, and failures such as pixel missing and the like can be prevented.

Further, a taper surface is provided on each of the gap adjusting member and the bump height adjusting member so that the thickness decreases toward the tip. Therefore, when the gap adjusting member is brought in contact with (g2) the bump height adjusting member, the taper surfaces can be brought in contact with each other. As a result, positioning in the lateral direction (planar direction) can be achieved by such a simple mechanism, thereby further decreasing the ratio of defective pixels.

The gap adjusting member is a member in a reticular pattern in which holes are disposed for the respective light-receiving element electrodes or read-out electrodes so that the bumps can be surrounded by a non-hole portion. Therefore, the gap between the light-receiving element array and the read-out circuit can be appropriately set, and the adjacent pixels can be securely separated from each other, thereby preventing short-circuiting between the adjacent pixels and the like.

The bump height adjusting member or the gap adjusting member can be made of an insulator. Even when the member contacts the bumps, wetting little occurs in many cases, and thus the possibility of failure due to contact can be decreased.

In addition, even when the member contacts the bumps, electric conduction does not occur, and thus there is no possibility of short-circuiting.

The bump height adjusting member or the gap adjusting member can be made of polyimide. Therefore, such an adjusting member can be simply formed by a photolithography process or the like.

The bumps can be made of In, AgSn, or AuSn, or such a material containing trace impurities. Since In is soft, the heights of the bumps can be easily made uniform by applying a load at room temperature. Also, AgSn, or AuSn, or such a material containing trace impurities has not so much a low melting point and is not so much soft as In, but can be easily deformed at a low temperature. Therefore, the heights can be easily controlled to be uniform.

The bumps can be made of a conductive resin. The soft bumps having desired heat resistance can be easily formed by changing the components or compounding ratio of the conductive resin.

The compound semiconductor multilayer includes an InP substrate and a light-absorbing layer formed on the InP substrate and having a band gap wavelength of 1.6 μm to 3.0 μm. The light-absorbing layer may have a type-II quantum well structure of GaAsSb/InGaAs, GaAsSb/InGaAsN, GaAsSb/InGaAsNP, or GaAsSb/InGaAsNSb, which has a lattice constant difference of 0.2% or less from the InP substrate.

The light-absorbing layer may be made of InGaAs, GaInNAsP, GaInNAsSb, or GaInNAs, which has a lattice constant difference of 0.2% or less from the InP substrate.

The light-receiving element array having any one of the two configurations causes small noise and can be used at room temperature. Further, when the electrodes are bonded with the bumps provided therebetween, short-circuiting between the adjacent pixels and the like can be prevented, and the electrodes of the read-out circuit and the light-receiving element array can be securely bonded, thereby causing no possibility of deterioration of bonding part due to stress and deformation during cooling.

According to the present invention, it is possible to realize a detection device excellent in economy and capable of achieving high bonding yield while decreasing the rate of defective pixels, and a method for manufacturing the same.

DESCRIPTION OF THE PREFERRED EMBODIMENTS

Before a specified structure of a detection device according to an embodiment of the present invention is described, various types of detection devices of the present invention are summarized. Detection devices of the present invention are classified by the way of incorporating the three components, i.e., a bump height adjusting member, a gap adjusting member, and bumps, as follows:

—Basic Form—

(1) Bump height adjusting member: A set of bump height adjusting members is provided, one per detection device, on a light-receiving element array or a read-out circuit. A set of bump height adjusting members is disposed in any one of various forms, for example, the bump height adjusting members are disposed at four corners, at opposite two corners, in a frame surrounding the array, or the like. The ends of the bump height adjusting members generally separate from the opposite side body in a product state.

(2) Gap adjusting member: (i) A gap adjusting member may not be provided. (ii) When a gap adjusting member is provided, a set of gap adjusting member is provided one per device. However, a set of gap adjusting members may includes one member or a plurality of members. The gap adjusting members may be fixed to the side to which the bump height adjusting members are fixed or the other side. The ends of the gap adjusting members come in contact with the opposite light-receiving element array or read-out circuit.

(3) Bump: In a step before bonding, bumps are generally provided on (i) one of the light-receiving element array and the read-out circuit. However, (ii) particularly, when the gap length is increased, the bumps are provided on both as described above.

—Modified Structure of Basic Form—

(H1)(i) In a structure, a bump height adjusting member comes in contact with a gap adjusting member. In this case, both members are fixed to different sides, not on the same side. (ii) In a structure belonging to the structure (i), a taper surface is provided on each of a bump height adjusting member and a gap adjusting member so that the thickness decreases toward the tip, and the taper surfaces come in contact with each other.

(H2) A gap adjusting member has a reticular pattern for separating adjacent pixels.

—Modified Structure Out of the Range of Basic Form—

In a structure, two bump height adjusting members are disposed. In a structure, a gap adjusting member includes a plurality of partial members.

First Embodiment

Figure 1:
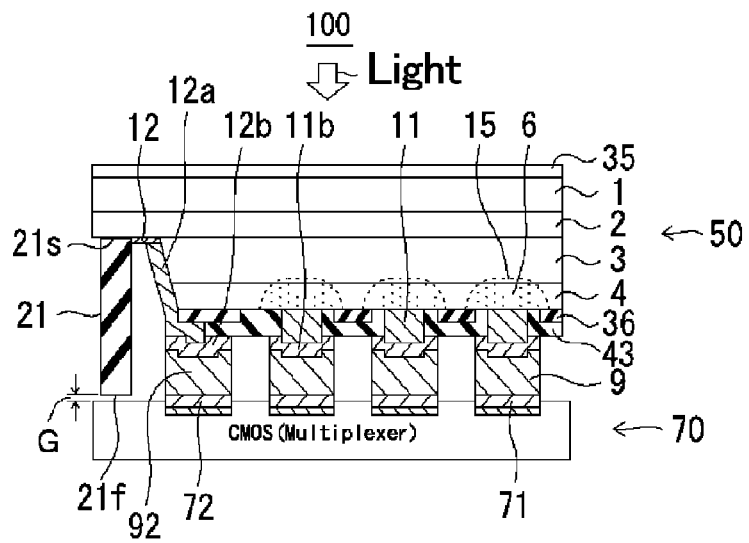
FIG. 1 is a sectional view showing a detection device according to a first embodiment of the present invention.

Type in which a Bump Height Adjusting Member has a Free End, a Gap Adjusting Member is not Provided, and Bumps are Provided on One Side FIG. 1 is a sectional view showing a detection device 100 according to a first embodiment of the present invention. A light-receiving element array 50 is formed in a multilayer of an InP substrate 1, an n-type buffer layer 2, a light-receiving layer (light-absorbing layer) 3, and a window layer 4. In each light-receiving element, zinc (Zn) as p-type impurities is introduced by selective diffusion to form a p-type region 6 and a pn junction 15. In addition, a p-side electrode 11 is in ohmic contact with the p-type region 6 and is connected to a read-out electrode 71 of a multiplexer 70 of a read-out circuit with a p-side bump 9 through a metal covering layer 11b. In addition, CMOS (Complementary Metal Oxide Semiconductor) is used for the multiplexer 70 of the read-out circuit. The portion including the p-type region 6, the p-side electrode 11, and the metal covering layer 11b corresponds to a pixel. An n-side electrode 12 which supplies a common ground potential to the p-side electrodes 11 is in ohmic contact with the n-side buffer layer 2 and is connected to a ground electrode 72 of the read-out circuit multiplexer 70 with a ground electrode-side bump 92 through n-side electrode wiring 12a and a metal covering layer 12b. The ground electrode 72 is provided in common to the read-out electrodes 71 of the read-out circuit multiplexer 70. Further, an antireflection film 35 is disposed at the bottom of the InP substrate 1 on which light is incident. A selective diffusion mask pattern 36 used in selective diffusion for the p-type regions 6 is left as it is, and a protective film 43 is provided to cover the openings of the selective diffusion mask pattern 36 or the surface of the window layer 4 and the selective diffusion mask pattern 36.

A bump height adjusting member 21 is fixed to the light-receiving element array 50 side. The end of the bump height adjusting member 21 is separated from the body of the read-out circuit multiplexer 70 on the opposite side and thus becomes a free end with a gap G maintained therebetween. The bump height adjusting member 21 is preferably made of an insulating material, e.g., polyimide. This embodiment does not use a gap adjusting member.

Figure 2:
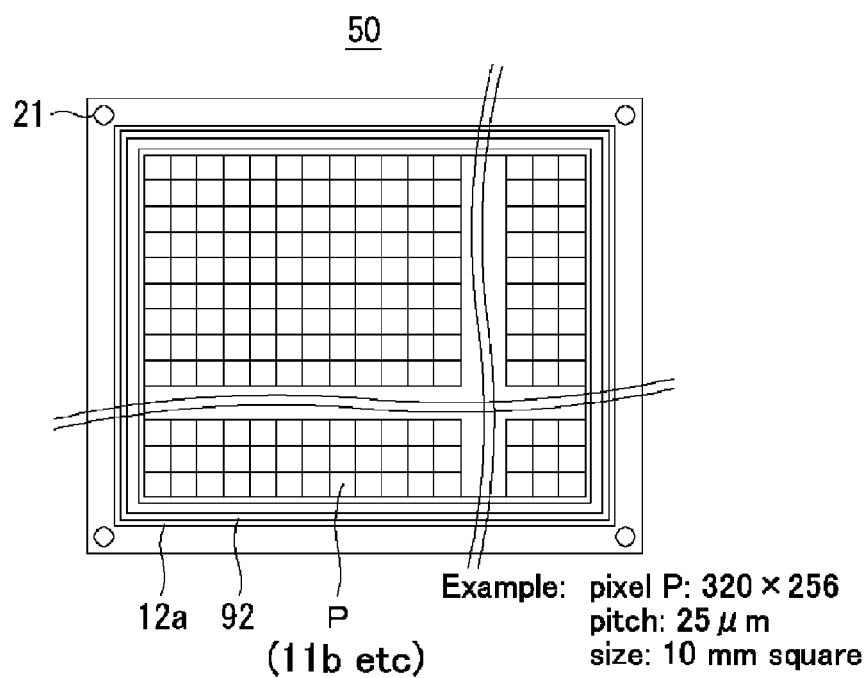
FIG. 2 is a plan view of a light-receiving element array of the detection device shown in FIG. 1 as viewed from the multiplexer side.

FIG. 2 is a drawing of the light-receiving element array 50 as viewed from the read-out circuit multiplexer 70 side. For example, the number of pixels P is 320×256, the pitch is 25 μm, the whole size is 10 mm square. The light-receiving element array 50 further includes the n-side electrode wiring 12a and the ground electrode-side bump 92 which are provided in common to surround the pixel arrangement. The bump height adjusting member 21 is provided at each of the four corners. Referring to FIGS. 1 and 2, the bump height adjusting members 21 have the shape of a cylindrical column, and four columns are disposed in the detection device 100.

Figure 3:
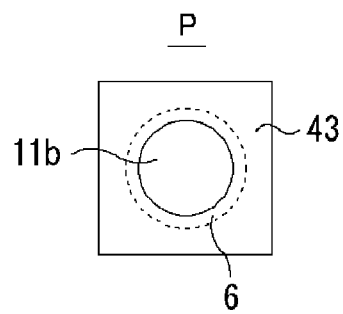
FIG. 3 is an enlarged view of a pixel shown in FIG. 2.

FIG. 3 is a drawing showing pixel P. A broken-line circle indicates the p-type region 6, and the metal covering layer 11b of the p-side electrode (not shown) is disposed in the circle. The periphery of the p-side electrode is covered with the protective film 43 composed of SiON or the like.

Figure 4:
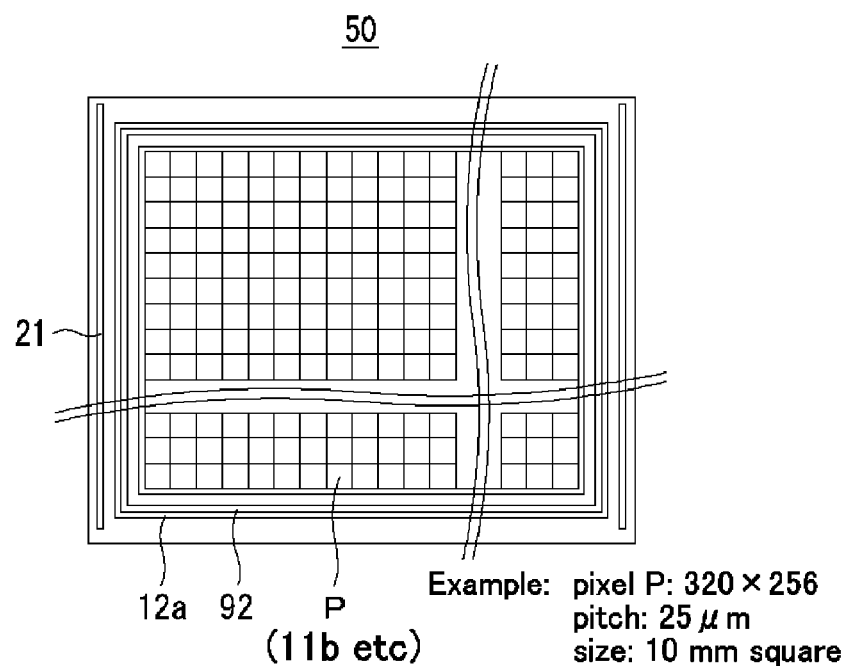
FIG. 4 is a plan view showing a modified example of the detection device of the present invention shown in FIG. 1.

FIG. 4 is a drawing corresponding to the light-receiving element array 50 shown in FIG. 2, and the bump height adjusting members 21 shown in FIG. 2 are modified. Namely, the light-receiving element array 50 shown in FIG. 4 is a modified example of the light-receiving element array 50 shown in FIGS. 1 and 2. In the modified example of FIG. 4, the bump height adjusting members 21 are formed to extend in a wall-like form. As described below, the bump height adjusting members 21 effectively function regardless of whether they are used as a plurality of columns or a plurality of extending walls.

Figure 5:
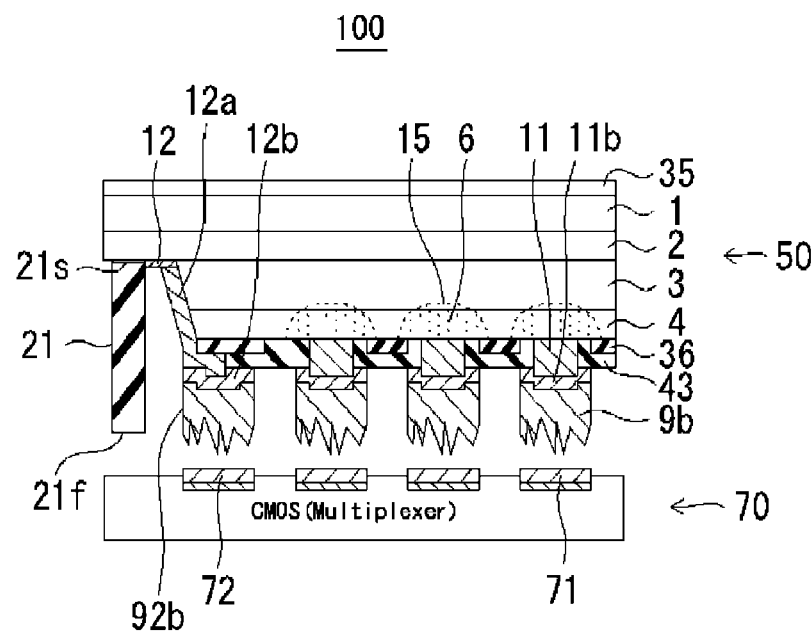
FIG. 5 is a drawing showing a state before a light-receiving element array and a multiplexer of the detection device shown in FIG. 1 are bonded together.
Figure 6:
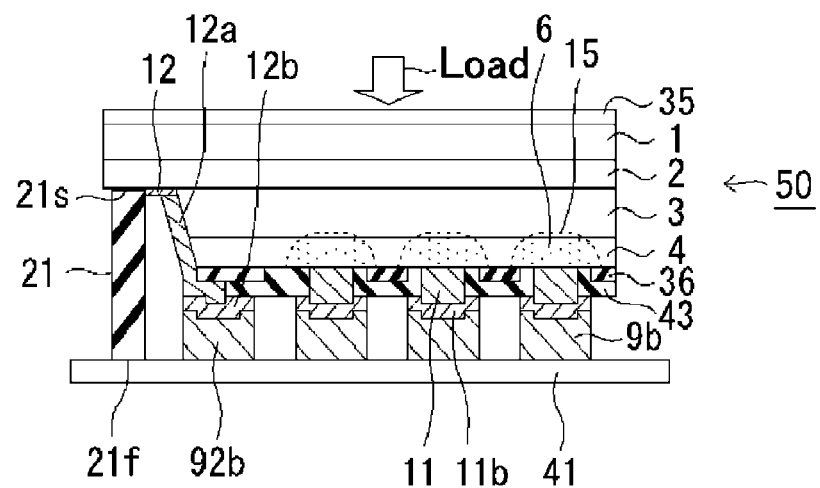
FIG. 6 is a sectional view showing a state in which bumps are shaped by compression using a bump height adjusting member and a flat plate.

FIG. 5 is a drawing showing the light-receiving element array 50 and the read-out circuit multiplexer 70 before bonding. The bumps 9b and 92b before bonding are provided on the metal covering layers 11b and 12b of the light-receiving element array 50. The bumps 9b and 92b have large irregularity and may be broken on one of the sides to have an inclined surface with irregularity. FIG. 6 shows a state the bumps 9b and 92b are adjusted using the bump height adjusting members 21. The bumps 9b and 92b are adjusted by compressive deformation in which a flat surface of a flat plate 41 is pressed on the ends of the bumps 9b and 92b and a load is applied thereto. As the flat plate 41, for example, a glass plate or the like can be used. The compressive deformation of the bumps 9b and 92b is performed until the flat plate 41 contacts the bump height adjusting members 21. The heights of the bumps 9b and 92b are determined by the height of the ends of the bump height adjusting members 21. When the bump height adjusting members 21 have the shape of a cylindrical column, it is difficult to stably arrange the flat plate 41 in parallel to a surface of the light-receiving element array 50, e.g., a surface of the InP substrate 1, unless three or more members are disposed. When the bump height adjusting members 21 extend in a wall-like form (refer to FIG. 4), a parallel state can be stably achieved by providing two members separately.

Figure 7:
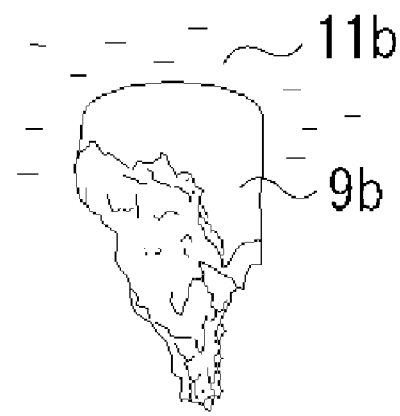
FIG. 7A is a drawing showing a bump before compressive shaping.
FIG. 7B is a drawing showing a bump after compressive shaping.
Figure 7:
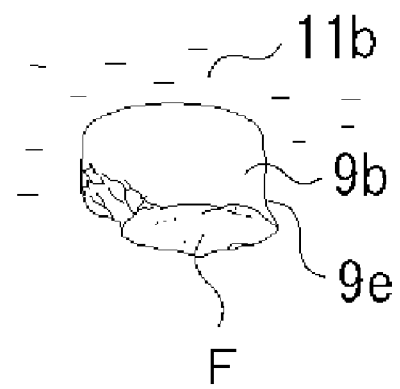

FIGS. 7A and 7B are drawings showing bumps before and after, respectively, the bumps 9b and 92b are adjusted using the flat plate 41 and the bump height adjusting members 21. The bumps 9b and 92b are composed of, for example, indium. As shown in FIG. 7A, before bonding, the end of the bump 9b is significantly inclined to form an inclined surface with irregularity. On the other hand, after compression processing shown in FIG. 6, as shown in FIG. 7B, the bump 9b is deformed in a lumpish shape having a flat end surface F. The side surface continuing from the flat surface F has a projecting portion 9e slightly projecting outward. When there are several tens of thousands to hundreds of thousands of the bumps 9b shown in FIG. 7A, the bumps 9b have various shapes. When these bumps 9b are bonded to the read-out electrodes 71 of the read-out circuit multiplexer 70 shown in FIG. 5, the contact areas with the read-out electrodes 71 may be very small or some of the bumps 9b do not come in contact the read-out electrodes 71. When the light-receiving element array 50 and the read-out circuit multiplexer 70 are bonded together, the bumps 9b and 92b are heated under predetermined welding force or level of press. In this case, if the bumps do not have sufficient contact areas, disconnection is caused. In addition, when the welding force or level of press is increased for increasing the contact areas, the bumps are extremely crushed to cause short-circuiting defect between adjacent pixels. It is very difficult to control the welding force or level of press so that all the several tens of thousands to hundreds of thousands of the bumps 9b appropriately contact the respective read-out electrodes 71 of the read-out circuit multiplexer 70. However, as shown in FIG. 7B, when the heights of the bumps are previously adjusted to form the flat surfaces F, all the several tens of thousands to hundreds of thousands of the bumps 9b can be easily brought into proper contact with the respective read-out electrodes 71 of the read-out circuit multiplexer 70. In addition, since the bumps are flattened before the light-receiving element array 50 and the read-out circuit multiplexer 70 are joined together, the light-receiving element array 50 and the read-out circuit multiplexer 70 can be actually bonded together after the bumps are appropriately flattened while being examined for a flattened state. As a result, all the several tens of thousands to hundreds of thousand of the bumps 9b can be easily bonded to the electrodes, and thus the detection device 100 in which the rate of defective pixels is significantly suppressed to a low value can be provided.

The bumps 9b and 92b are provided by a liftoff method on the metal covering layers 11b and 12b of the p-side electrodes 11 and the n-side electrode 12 of the light-receiving element array 50, and the ends of the bumps are subjected to compressive shaping shown in FIG. 6. Then, the bumps are bonded to the read-out electrodes 71 of the read-out circuit multiplexer 70 while being pressed thereon. The bases of the bumps formed by the liftoff method have an outer shape formed by a substantially straight generating line as shown in FIG. 7A and are not much changed after bonding. In addition, the tops of the bumps can be easily discriminated from the bases because the flat plate 41 is pressed on the tops to form the projecting portions 9e slightly projecting outward. The height of the bump height adjusting members 21 is substantially the same as the height of the tops of the bumps 9b or slightly larger than the tops of the bumps 9b by an amount corresponding to compression during bonding.

Unlike in this embodiment, when the bumps 9b and 92b are provided on both, the bases are the same as described above. The projecting portions 9e are produced on the bumps on both sides at junctions between the bumps 9b and 92b on both sides. The heights of the tops of the projecting portions 9e coincide with the height of the tops of the bump height adjusting members 21 within a range of compressive deformation during bonding. Further, the bases of the bump height adjusting members 21 are fixed to the light-receiving element array 50 with an adhesive layer 21s, while the top of a basic form is a free end and separates from the body of the opposite side.

—Light-Receiving Element Array—

The light-receiving element array according to the embodiment is described. The detection device 100 according to the embodiment can be applied to light in any wavelength region, but is particularly suitable for detection using near infrared light. The light-receiving element array is heated during pressure bonding of bumps. This is because it is desired to simply securely perform pressure bonding within a short time because a soft compound semiconductor is used. Therefore, it is preferred to previously perform compressive shaping of the bumps. Hereinafter, particularly the InP-based light-receiving element array 50 having photosensitivity to near infrared light is described.

(1) Detailed Structure of Semiconductor Light-Receiving Element Array

Figure 8:
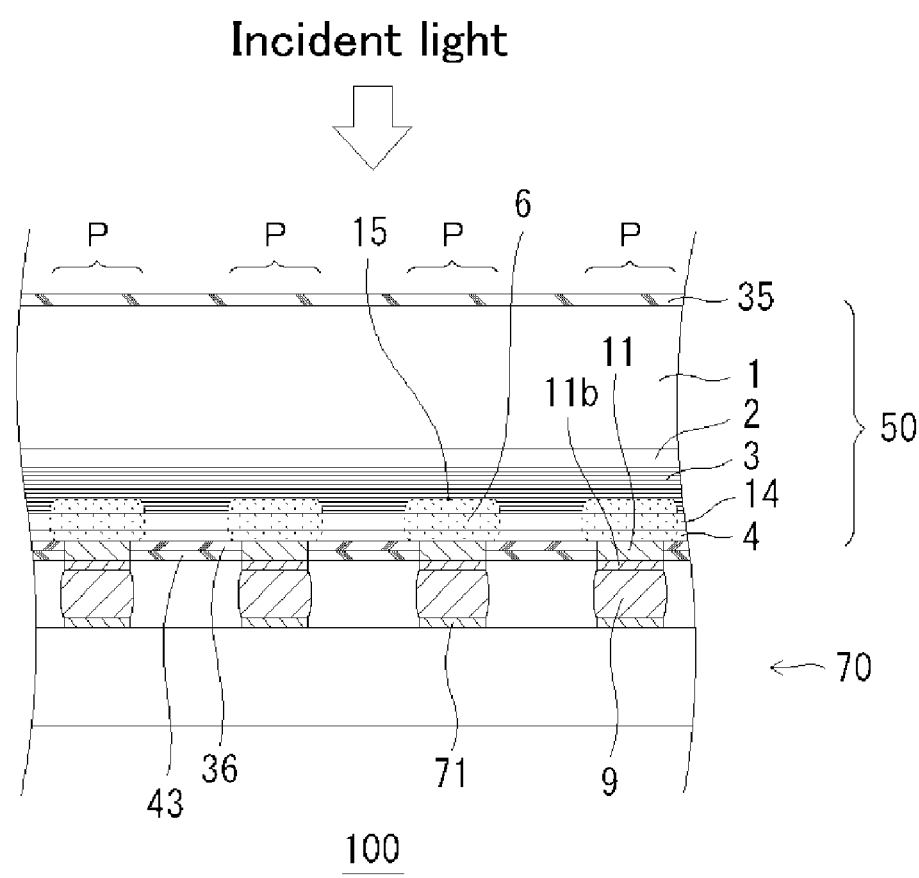
FIG. 8 is a drawing illustrating the light-receiving element array of the detective device according to the first embodiment.

FIG. 8 is a drawing illustrating the light-receiving element array 50 according to the first embodiment. In FIG. 8, the light-receiving element P of each pixel includes a group III-V semiconductor multilayered structure (epitaxial wafer) having the following configuration on the InP substrate 1:

(InP substrate 1/n-type InP buffer layer 2/light-receiving layer 3 with a multiquantum well structure of InGaAs or GaInNAs and GaAsSb/diffusion concentration distribution control layer 14/InP window layer 4)

The p-type region 6 extending from the InP window layer 4 to the multiquantum well structure light-receiving layer 3 is formed by selective diffusion of Zn as p-type impurities from an opening of the selective diffusion mask pattern 36 including a SiN film. Diffusive introduction limited to the inside of the periphery of each pixel in a planar region is realized by diffusion using the selective diffusion mask pattern 36 including a SiN film.

The AuZn p-side electrode 11 and the AuGeNi n-side electrode (not shown) are provided to be in ohmic contact with the p-type region 6 and the n-type InP buffer layer 2, respectively. In this case, the n-type InP buffer layer 2 is doped with n-type impurities to secure a predetermined level of conductivity. In addition, the SiON antireflection film 35 is provided on the back surface of the InP substrate 1 so that the device can be also used by applying incident light to the back surface of the InP substrate 1.

The multiquantum well structure light-receiving layer 3 has a pn junction 15 formed at a position corresponding to a boundary front of the p-type region 6. When a reverse bias voltage is applied between the p-type electrode 11 and the n-side electrode (not shown), a wider depletion layer is produced on the lower n-type impurity concentration side (n-type impurity background). The background in the multiquantum well structure light-receiving layer 3 is a n-type impurity concentration (carrier concentration) of about $5 \times 10^{15}/cm^3$ or less. The position of the pn junction 15 is determined by an intersection of the n-type carrier concentration of the background of the multiquantum well structure light-receiving layer 3 and the concentration profile of Zn as p-type impurities. In order to improve electric conductivity of the multiquantum well structure light-receiving layer 3 with the p-side electrode 11 while preventing deterioration in crystallinity by selective diffusive introduction of Zn as p-type impurities, the diffusion concentration distribution control layer 14 is inserted between the light-receiving layer 3 and the window layer 4. The Zn concentration is high in a window layer 4 side portion of the diffusion concentration distribution control layer 14 in the thickness direction, but the Zn concentration is slightly low in a light-receiving layer 3 side portion of the diffusion concentration distribution control layer 14 in the thickness direction. In the diffusion concentration distribution control layer 14, the concentration of p-type impurities selectively diffused from the surface of the InP window layer 4 is steeply decreased from the high-concentration region on the InP window layer side to the light-receiving layer side. The diffusion concentration distribution control layer 14 is preferably composed of InGaAs which is little increased in electric resistance even when there is a thickness portion at a low impurity concentration (a predetermined thickness portion on the light-receiving layer side) due to the relatively low band gap energy. Although the diffusion concentration distribution control layer 14 is not shown in FIG. 1, the diffusion concentration distribution control layer 14 is preferably provided for improving crystallinity of the multiquantum well structure light-receiving layer 3. However, the diffusion concentration distribution control layer 14 may not be necessarily provided. In second to eighth embodiments of the present invention which will be described below, the diffusion concentration distribution control layer 14 is not particularly described, but the diffusion concentration distribution control layer 14 is preferably provided for improving crystallinity of the multiquantum well structure light-receiving layer 3.

By inserting the above-described diffusion concentration distribution control layer 14, a Zn impurity concentration of $5 \times 10^{16}/cm^3$ or less can be easily realized in the light-receiving layer 3. The light-receiving element array 50 as an object of the present invention is intended to have photosensitivity to the longer wavelength side from the near infrared region. Therefore, a material having larger band gap energy than the band gap energy of the light-receiving layer 3 is preferably used for the window layer 4. Thus, InP which generally has good lattice matching and larger band gap energy than that of the light-receiving layer 3 is used for the window layer 4. InAlAs having substantially the same band gap energy as that of InP may be used.

The light-receiving layer 3 preferably has a type II multiquantum well structure. In the case of a light-receiving element with a type I multiquantum well structure in which a semiconductor layer with small band gap energy is sandwiched between semiconductor layers with large band gap energy, and photosensitivity is provided in a near infrared region, the upper limit of the wavelength (cut-off wavelength) of photosensitivity is determined by the band gap energy of the semiconductor layer with small band gap energy. That is, electron or hole transition by light is effected in the semiconductor layer with small band gap energy (direct transition). In this case, a material used for extending the cut-off wavelength to a longer wavelength region is limited within the group III-V compound semiconductors. On the other hand, in a type II multiquantum well structure, when two different types of semiconductor layers having common Fermi energy are alternately laminated, the upper limit of the wavelength (cut-off wavelength) of photosensitivity is determined by an energy difference between the conduction band of a first semiconductor and the valence band of a second semiconductor. That is, electron or hole transition by light is effected between the valence band of the second semiconductor and the conduction band of the first semiconductor (indirect transition). Therefore, the energy of the valence band of the second semiconductor is made higher than that of the first semiconductor, and the energy of the conduction band of the first semiconductor is made lower than that of the second semiconductor. As a result, photosensitivity in a longer wavelength region can be easily realized as compared with the case of direct transition in a semiconductor.

(2) Method for Manufacturing Light-Receiving Element Array

As described above, diffusive introduction of p-type impurities is limited to the inside of the periphery of a light-receiving element in a planar region using the selective diffusion mask pattern 36, and thus the pn junction 15 is not exposed at the end surface of a light-receiving element. As a result, leakage of photocurrent is suppressed. As shown in FIG. 8, a plurality of pixel portions P are arranged without element separation grooves. As described above, the p-type region 6 is limited to the inside of each pixel portion P and is securely separated from adjacent pixel portions P.

The n-type InP or n-type InGaAs buffer layer 2 having a thickness of 2 μm is deposited on the InP substrate 1. Then, the light-receiving layer 3 with a (InGaAs/GaAsSb) or (GaInNAs/GaAsSb) multiquantum well structure is formed. InGaAs has the composition $In_{0.53}Ga_{0.47}As$ so as to produce lattice matching with InP, and GaAsSb has the composition $GaAs_{0.52}Sb_{0.48}$. Therefore, the degree of lattice matching ($|\Delta a/a|$ wherein a is a lattice constant, and $\Delta a$ is a lattice constant difference) is 0.002 or less.

The thickness of the InGaAs layer (or the GaInNAs layer) constituting a unit quantum well structure is 5 nm, and the number of the pairs (number of repetitions of unit quantum well) is 300. Next, an InGaAs layer having a thickness of 1 μm is epitaxially grown as the diffusion concentration distribution control layer 14 for Zn diffusion introduction, and then finally the InP window layer 4 having a thickness of 1 μm is epitaxially grown. Both the light-receiving layer 3 and the diffusion concentration distribution control layer 14 are preferably epitaxially grown by a MBE method (Molecular Beam Epitaxy) method. The InP window layer 4 may be epitaxially grown by a MBE method or epitaxially grown by a MOVPE (Metal Organic Vapor Phase Epitaxy) method after the diffusion concentration distribution control layer 14 is grown and then taken out from a MBE apparatus.

As the InP substrate 1, a Fe-containing semi-insulating substrate is preferably used because good crystallinity is easily obtained. When the semi-insulating InP substrate is used, the n-type InP buffer layer 2 or n-type InGaAs buffer layer 2 is preferably doped with n-type impurities for achieving good conductive contact with the n-side electrode 12 as shown in FIG. 1, etc. For example, the buffer layer 2 is doped with about $1 \times 10^{17}/cm^3$ of n-type dopant such as Si or the like. The light-receiving layer 3 with a GaInNAs/GaAsSb multiquantum well structure, the InGaAs diffusion concentration distribution control layer 14, and the InP window layer 4 are preferably undoped but may be doped with a trace (for example, about $2 \times 10^{15}/cm^3$) of n-type dopant such as Si or the like. In addition, an n-side electrode-forming layer of high concentration may be inserted between the InP substrate 1 and the buffer layer 2 in order to form an n-side electrode doped with about 1E18 $cm^{-3}$ of n-type dopant.

In FIG. 8, the pn junction 15 should be widely interpreted as follows: The pn junction 15 includes a junction formed between the above-described p-type region 6 formed by diffusion introduction and an impurity region (referred to as an "i region") having an impurity concentration which is as low as to be considered as an intrinsic semiconductor on a side opposite to the side where p-type impurity element Zn is introduced by selective diffusion in the light-receiving layer 3. Namely, the pn junction 15 may be a pi junction and further includes a case in which the p-concentration of the pi junction is very low.

As described above, the p-type region 6 is formed to extend to the inside of the light-receiving layer 3 with an InGaAs/GaAsSb (or GaInNAs/GaAsSb) multiquantum well structure by selective diffusion of Zn from an opening of the SiN selective diffusion mask pattern 36 formed on the surface of the InP window layer 4. The front end of the p-type region 6 forms the pn junction 15. In this case, preferably, a high-concentration region of a Zn concentration of about $1 \times 10^{18}/cm^3$ is limited to the inside of the InGaAs diffusion concentration distribution control layer 14. That is, the high-concentration impurity distribution continues from the surface of the InP window layer 4 to the inside of the InGaAs diffusion concentration distribution control layer 14 in the thickness direction, and further the impurity concentration decreases to $5 \times 10^{16}/cm^3$ or less at a deeper position in the InGaAs diffusion concentration distribution control layer 14. The Zn concentration distribution near the pn junction 15 becomes a distribution showing graded type junction.

In the light-receiving element array 50, the adjacent light-receiving elements are separated from each other by Zn selective diffusion (limited to the inside of the periphery of each light-receiving element in a planar region) without mesa etching for element separation. Namely, the Zn selectively diffused region 6 is a main portion of each pixel P, and the respective pixels are separated from each other by regions in which Zn is not diffused. Therefore, crystal damage associated with mesa etching does not occur, and dark current can be suppressed.

As described above, the light-receiving element array 50 of this embodiment is formed by micro-processing a multilayer of brittle group III-V compound semiconductors. Therefore, when the read-out circuit multiplexer 70 and the light-receiving element array 50 are bonded together, it is important to use the soft bumps 9b and 92b. As shown in FIG. 7A, a soft bump such as an In bump or the like has a projecting portion, thereby causing difficulty in secured one-to-one bonding. An idea according to the present invention has been created on such a background.

When the pn junction 15 is formed by selective diffusion of impurities, there is the possibility that the element space cannot be decreased by a predetermined value or more because diffusion proceeds in not only the depth direction but also the lateral direction (perpendicular to the depth direction). However, in actual selective diffusion of Zn, it was confirmed that in a structure including the InP window layer 4 provided at the uppermost surface and the InGaAs diffusion concentration distribution control layer 14 disposed below the window layer 4, lateral diffusion is suppressed to an extent equal to or lower than that in the depth direction. That is, in Zn selective diffusion, Zn diffuses in the lateral direction in a region larger than the opening diameter of the selective diffusion mask pattern 36. However, the degree of lateral diffusion is small, and Zn diffuses in a region slightly wider than the opening of the mask patter as schematically shown in FIG. 8, etc.

The InP substrate 1 is preferably an off-angle substrate with an off-angle of 5 to 20° in the [111] direction or [1-1] direction from (100). The off-angle is preferably 10 to 15° in the [111] direction or [11-1] direction from (100). By using the substrate with such a large off-angle, the n-type InP buffer layer 2 having low defect density and excellent crystallinity, the type-II quantum well structure light-receiving layer 3, the InGaAs diffusion concentration distribution control layer 14, and the InP window layer 4 can be formed.

Second Embodiment

Figure 9:
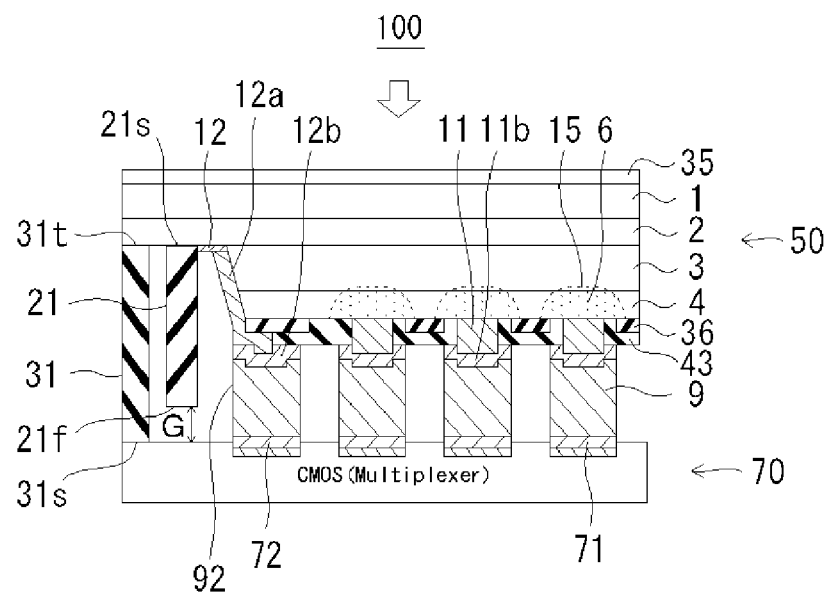
FIG. 9 is a sectional view showing a detection device according to a second embodiment of the present invention.
Figure 10:
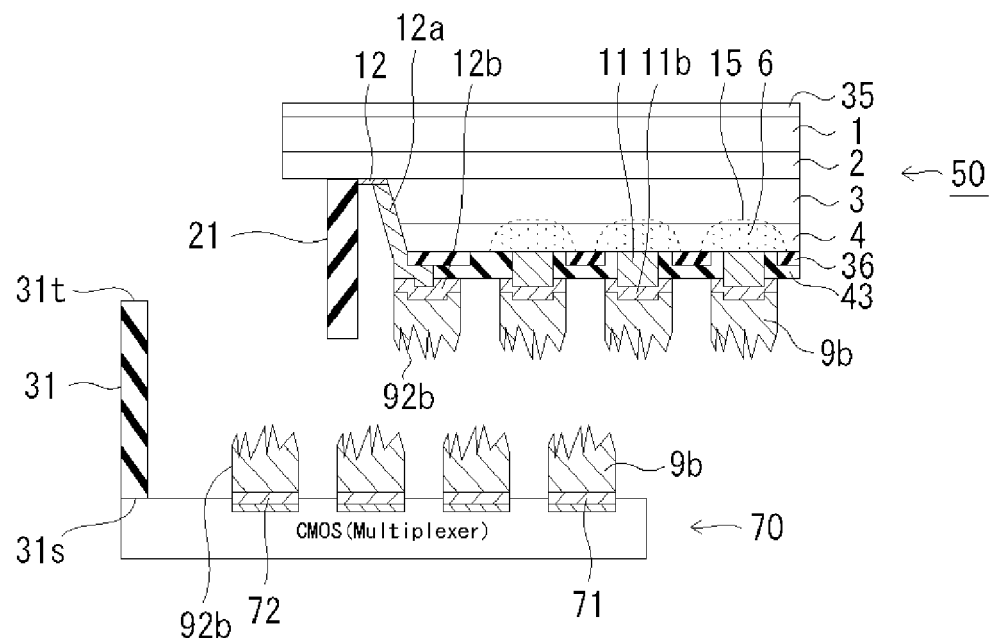
FIG. 10 is a drawing showing a state before a light-receiving element array and a multiplexer of the detection device shown in FIG. 9 are bonded together.
Figure 11:
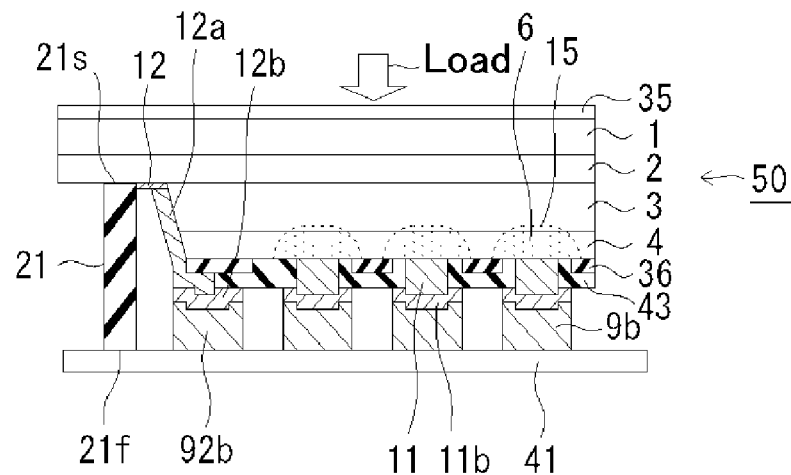
FIG. 11 is a sectional view showing a state in which bumps are shaped by compression using a bump height adjusting member and a flat plate.

Type in which a Bump Height Adjusting Member has a Free End, a Gap Adjusting Member is Provided, and Bumps are Provided on Both Sides FIG. 9 is a sectional view showing a detection device 100 according to a second embodiment of the present invention. FIG. 10 is a drawing showing a state before a light-receiving element array 50 and a read-out circuit multiplexer 70 are bonded together. FIG. 11 is a drawing showing a state in which bumps 9b and 92b are processed by compression using a bump height adjusting member 21 and a flat plate 41. Since the light-receiving element array 50 and the read-out circuit multiplexer 70 are the same as in the first embodiment, they are not described below. In embodiments described below, the light-receiving element array 50 and the read-out circuit multiplexer 70 are the same as in the first embodiment unless otherwise specified. The detection device 100 according to this embodiment is characterized by the following two points:

(1) The gap between the light-receiving element array 50 and the read-out circuit multiplexer 70 is large. That is, the height of p-side bumps 9 and a ground electrode side-bump 92 is large. As shown in FIG. 10, this is because the bumps 9b and 92b are provided on both sides. When bump compression margin during bonding is increased by increasing the height of the bumps in order to absorb the influence of warpage and irregularity of silicon and a compound semiconductor, the bumps 9b and 92b are provided on both sides. In this case, when the bumps are formed by evaporation or the like, the bump height can be more efficiently obtained by providing the bumps 9b and 92b on both the light-receiving element array 50 and the read-out circuit multiplexer 70.

(2) A gap adjusting member 31 is fixed to the read-out circuit multiplexer 70 with an adhesive layer 31s. The end surface 31t of the gap adjusting member 31 comes in contact with a compound semiconductor layer, for example, the n-type buffer layer 2, in the light-receiving element array 50. When the end surfaces 31t of three or more gap adjusting members 31 come in contact with a compound semiconductor layer, the gap between the read-out circuit multiplexer 70 and the light-receiving element array 50 can be stably maintained constant over the entire region. The end 21f of the bump height adjusting member 21 fixed to a compound semiconductor layer with an adhesive layer 21s is a free end. The adhesive layers 21s and 31s can be replaced with mechanical cramps.

Even when the bumps are provided on both sides, as shown in FIGS. 10 and 11, the bump height adjusting member 21 may be provided on only one side. As shown in FIG. 11, when compressive processing is performed using the bump height adjusting member 21 provided on only one side, the bumps 9b and 92b on one side have a shape having irregular projection as shown in FIG. 7A. The bumps 9b and 92b subjected to compressive processing are deformed in a blocky shape as shown in FIG. 7B and have flat surfaces F. When the bumps 9b and 92b on both sides have the shape shown in FIG. 7A, in may pixel portions, the bumps slip on each other and deviate and project to the adjacent pixel regions. When there are several tens of thousands to several hundreds of thousands of the bumps shown in FIG. 7A, slippage between bumps, deviation, projection, and the like occur at a high ratio. On the other hand, when the bumps on only one side are shaped to have flat surfaces F as shown in FIG. 7B, the flat surfaces F serve as receiving portions for the projecting portions on the opposite side, thereby significantly suppressing deviation to adjacent pixel portions.

Third Embodiment

Figure 12:
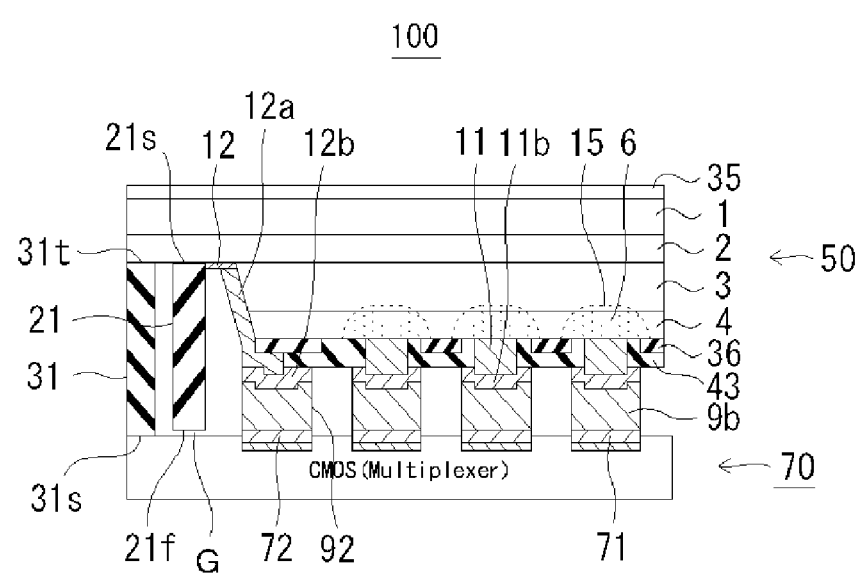
FIG. 12 is a sectional view showing a detection device according to a third embodiment of the present invention.
Figure 13:
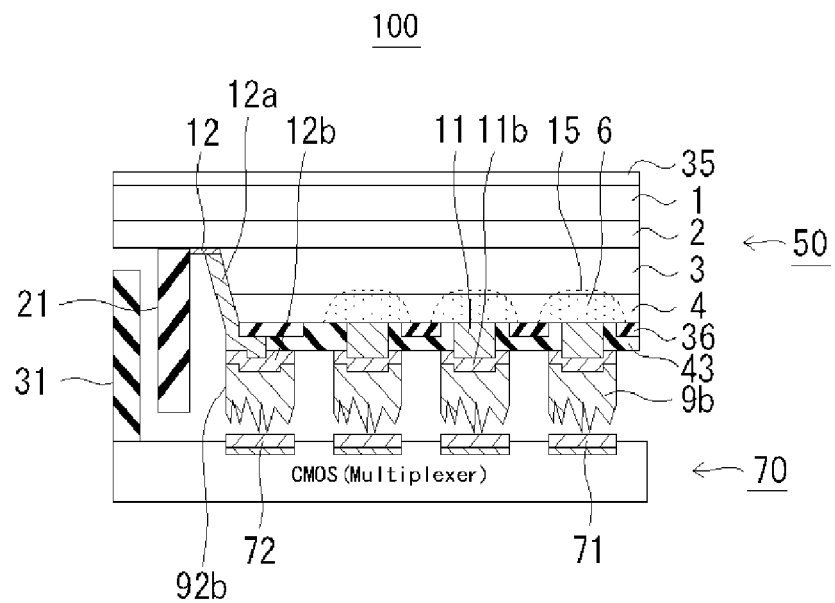
FIG. 13 is a drawing showing a state before a light-receiving element array and a multiplexer of the detection device shown in FIG. 12 are bonded together.

Type in which a Bump Height Adjusting Member has a Free End, a Gap Adjusting Member is Provided, and Bumps are Provided on One Side FIG. 12 is a sectional view showing a detection device 100 according to a third embodiment of the present invention. FIG. 13 is a drawing showing a state before a light-receiving element array 50 and a read-out circuit multiplexer 70 are bonded together. Although this embodiment is the same in many portions as the detection device 100 of the second embodiment, this embodiment is characterized as follows.

(1) A bump height adjusting member 21 is fixed to the light-receiving element array 50 side with an adhesive layer 21s. In addition, bumps 9b and 92b are provided on only one side, of course, on the side on which the bump height adjusting member 21 is fixed.

(2) A gap adjusting member 31 is fixed to the read-out circuit multiplexer 70 side, and the end thereof is in contact with an n-type buffer layer 2 as a compound semiconductor layer. The end 21f of the bump height adjusting member 21 is a free end.

In this configuration, the bumps 9b and 92b shown in FIG. 13 are subjected to compressive shaping with the bump height adjusting member 21 and a flat plate. Therefore, the phenomenon that the bumps 9b and 92b project to adjacent pixels during bonding is significantly suppressed. As a result, the rate of defective pixels is significantly decreased.

Fourth Embodiment

Figure 14:
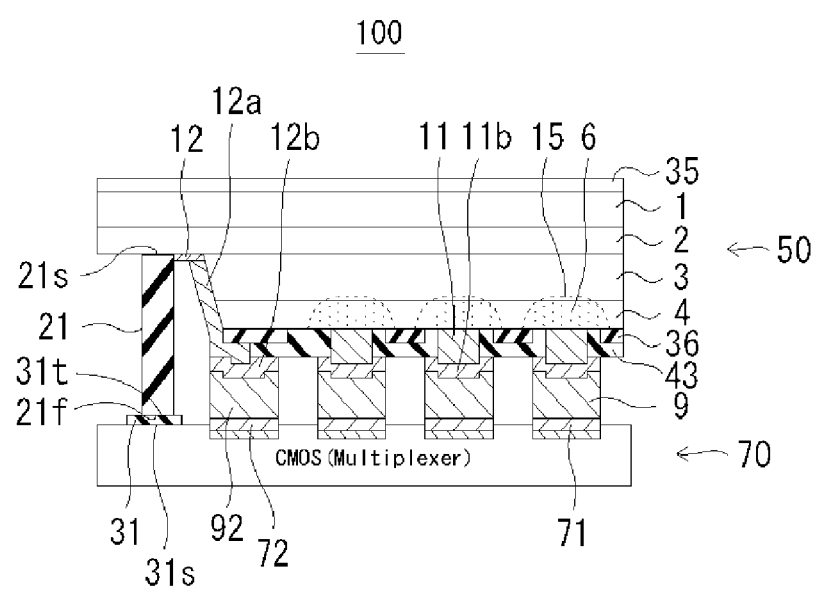
FIG. 14 is a sectional view showing a detection device according to a fourth embodiment of the present invention.
Figure 15:
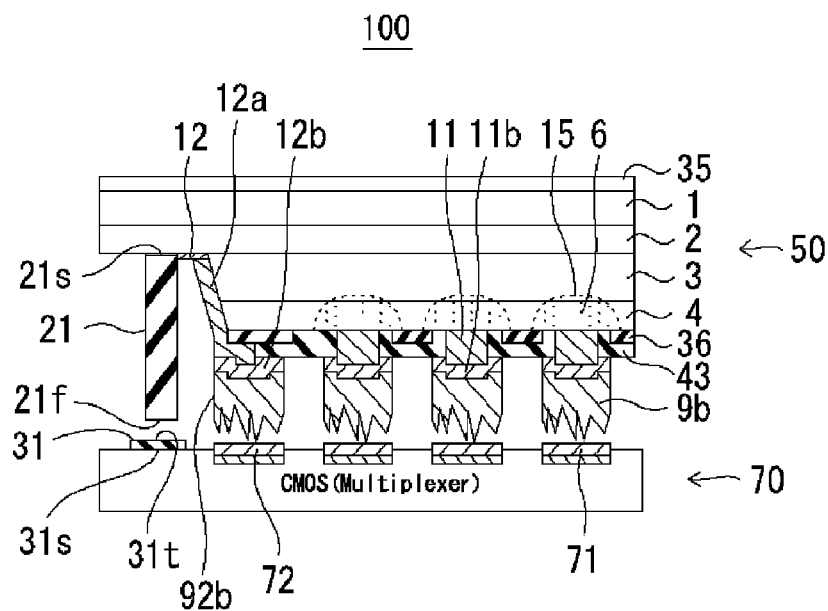
FIG. 15 is a drawing showing a state before a light-receiving element array and a multiplexer of the detection device shown in FIG. 14 are bonded together.

Type in which a Bump Height Adjusting Member is in Contact with a Gap Adjusting Member, and Bumps are Provided on One Side FIG. 14 is a sectional view showing a detection device 100 according to a fourth embodiment of the present invention. FIG. 15 is a drawing showing a state before a light-receiving element array 50 and a read-out circuit multiplexer 70 are bonded together. This embodiment is characterized as follows.

(1) A bump height adjusting member 21 and a gap adjusting member 31 are provided one each, and the end surfaces 31t and 21f are in contact with each other. The bump height adjusting member 21 and the gap adjusting member 31 are fixed with adhesive layers 21s and 31s, respectively.

In this structure, as described above, the rate of defective pixels can be decreased, and the height of the gap adjusting member 31 can be significantly decreased. This contributes to decreases in member cost and weight. In addition, since the end of the bump height adjusting member 21 is not a free end and is in contact with the gap adjusting member 31, there is the advantage that the bump height adjusting member 21 is stably maintained.

—Structure in which the Bump Height Adjusting Member 21 is in Contact with the Gap Adjusting Member 31—

The title structure is summarized.

(1) This embodiment corresponds to a case in which the top of the bump height adjusting member 21 comes in contact with the gap adjusting member 31 and is not a free end. The base portion of the gap adjusting member 31 is fixed with the adhesive layer 31s, and the top thereof is in contact with the bump height adjusting member 21. In the bonding state shown in FIG. 14, the base portions of the p-side bumps 9 and the ground electrode-side bumps 92 can be easily discriminated from the tops thereof due to the above-described characteristics. Therefore, the bump height adjusting member 21 and the gap adjusting member 31 can be easily discriminated from each other.

(2) Even when the bumps 9b and 92b are provided on both sides, the bump height adjusting member 21 and the gap adjusting member 31 can be easily discriminated from each other. As described above, the bump height adjusting member 21 and the gap adjusting member 31 can be easily discriminated from each other by observing the shapes of the adhesive layers 21s and 31s of both members and the p-side bumps 9 and the ground electrode-side electrodes 92. The bump height adjusting member 21 and the gap adjusting member 31 are generally provided by, for example, photolithography and metal evaporation/polyimide film formation on the array or IC. Infrequently, a semiconductor epitaxial layer is partially etched to form a projection as a height adjusting member. However, in such a case, the bump height adjusting member 21 and the gap adjusting member 31 can be discriminated from each other. As described above, the adhesive layers 21s and 31s can be replaced with mechanical cramps.

(3) If the bump height adjusting member 21 is integrated with the light-receiving element array 50, and the gap adjusting member 31 is integrated with the read-out circuit multiplexer 70, one of both members can be discriminated as the bump height adjusting member 21 because the height of the top of the bump height adjusting member 21 coincides with the height of the tops of the bumps due to the shapes of the p-side bumps 9 and the ground electrode-side electrodes 92.

(4) As a supplement to (3), when the bumps 9b and 92b are provided on both sides, it seems possible to adjust the gap by fixing bump height adjusting members 21 to both sides and bringing the tops of both in contact with each other. However, such a structure is impossible. This is because when the tops of both bump height adjusting members 21 come in contact with each other by compressive processing of the bumps 9a and 92b on both sides as shown in FIG. 6, there is no overlap between the bumps on both sides, thereby making bonding impossible.

(5) The top of the bump height adjusting member 21 is a free end unless it comes in contact with the gap adjusting member 31. In addition, when the top of the bump height adjusting member 21 is in contact with another member, the contact member can be considered as the gap adjusting member 31.

Fifth Embodiment

Figure 16:
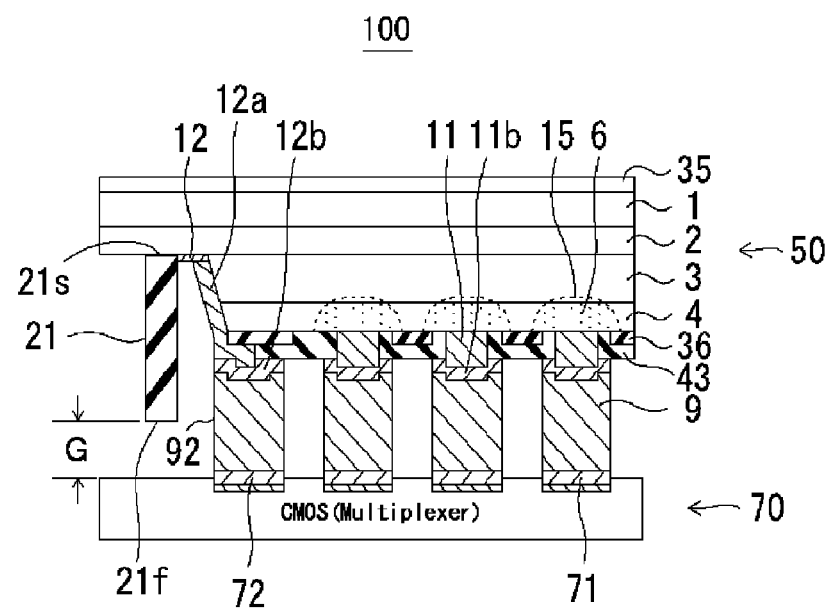
FIG. 16 is a sectional view showing a detection device according to a fifth embodiment of the present invention.
Figure 17:
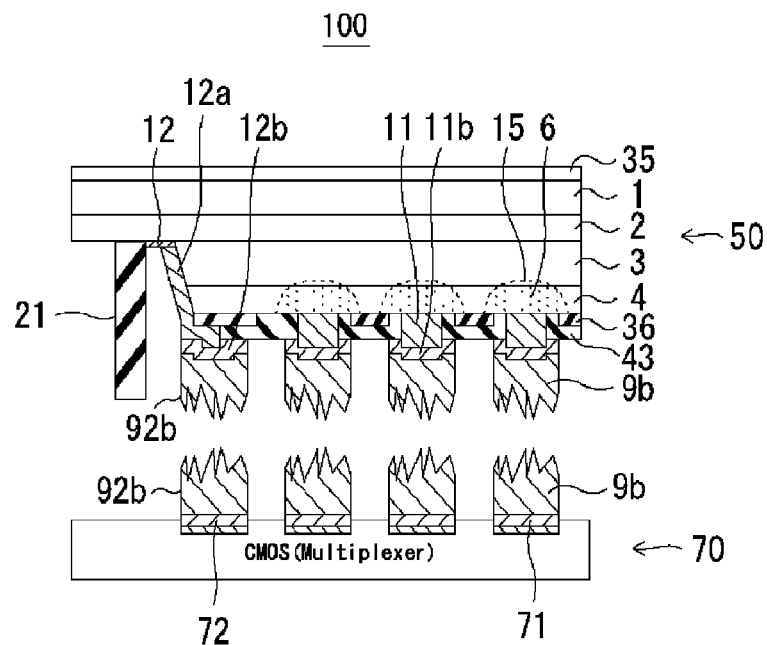
FIG. 17 is a drawing showing a state before a light-receiving element array and a multiplexer of the detection device shown in FIG. 16 are bonded together.

Type in which a Bump Height Adjusting Member has a Free End, a Gap Adjusting Member is not Provided, and Bumps are Provided on Both Sides FIG. 16 is a sectional view showing a detection device 100 according to a fifth embodiment of the present invention. FIG. 17 is a drawing showing a state before a light-receiving element array 50 and a read-out circuit multiplexer 70 are bonded together. This embodiment is characterized as follows.

(1) As shown in FIG. 17, bumps 9b and 92b are provided on both the light-receiving element array 50 and the read-out circuit multiplexer 70. Therefore, like in the second embodiment, the gap between the light-receiving element array 50 and the read-out circuit multiplexer 70 is large. As a result, the influence of warpage and irregularity of silicon and a compound semiconductor can be absorbed.

(2) Unlike in the second embodiment, a gap adjusting member is not used. Although the top of the bump height adjusting member 21 is a free end, the bumps 9b and 92b are provided on both sides as described above in (1), and thus the gap G between the light-receiving element array 50 and the read-out circuit multiplexer 70 is larger than that in a structure in which bumps are provided on only one side.

As seen from FIG. 17, the bumps 9b and 92b on the light-receiving element array 50 are subjected to compressive shaping using the bump height adjusting member 21 and a flat plate 41. As described above, when the bumps 9b and 92b with the shape shown in FIG. 7A on both sides are bonded, in many pixel portions, the bumps slip on each other and deviate and project to the adjacent pixel regions. When there are several tens of thousands to several hundreds of thousands of the bumps shown in FIG. 7A, slippage between bumps, deviation, projection, and the like occur at a high ratio. On the other hand, when the bumps on only one side are shaped to have flat surfaces F as shown in FIG. 7B, the flat surfaces F serve as receiving portions for the projecting portions on the opposite side, thereby significantly suppressing deviation to adjacent pixel portions. As a result, the influence of warpage and irregularity of silicon and a compound semiconductor can be absorbed, and the ratio of defective pixels can be decreased.

Sixth Embodiment

Figure 18:
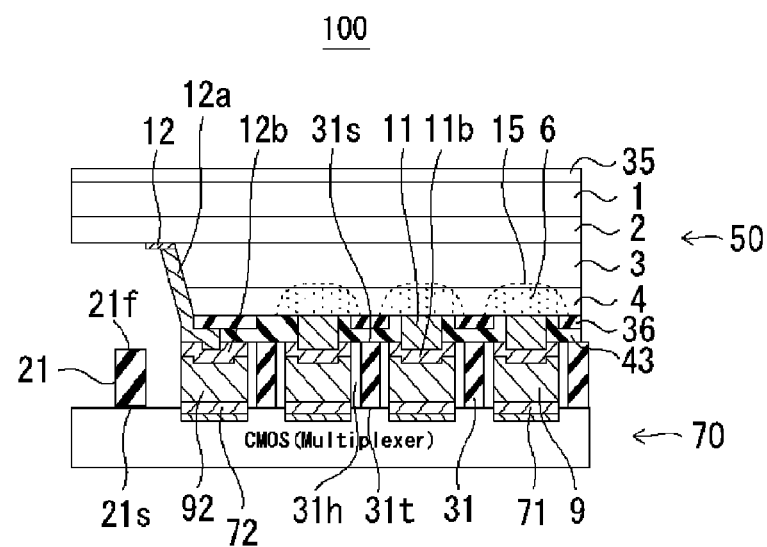
FIG. 18 is a sectional view showing a detection device according to a sixth embodiment of the present invention.
Figure 19:
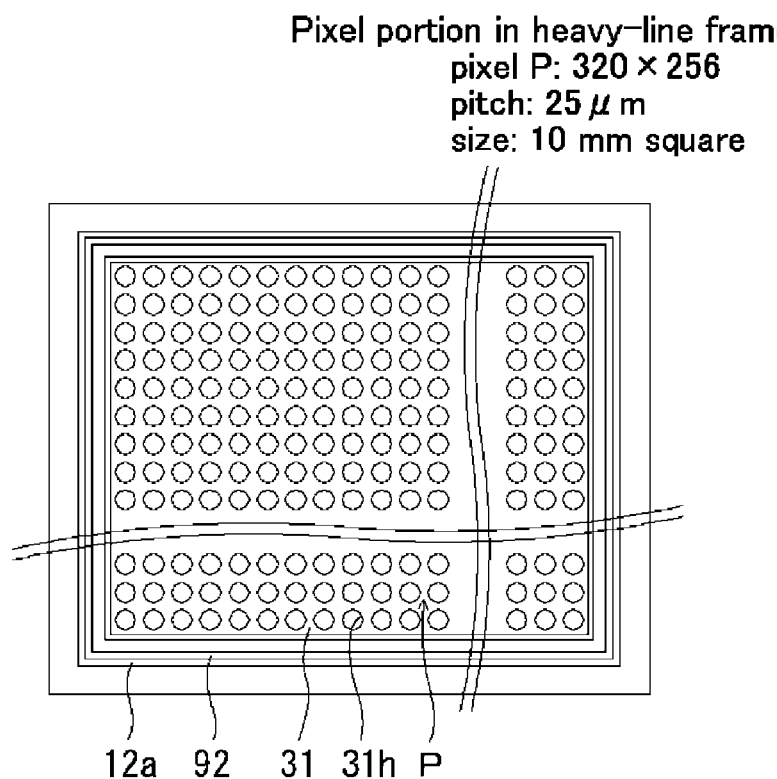
FIG. 19 is a plan view of a light-receiving element array of the detection device shown in FIG. 18 as viewed from the multiplexer side.
Figure 20:
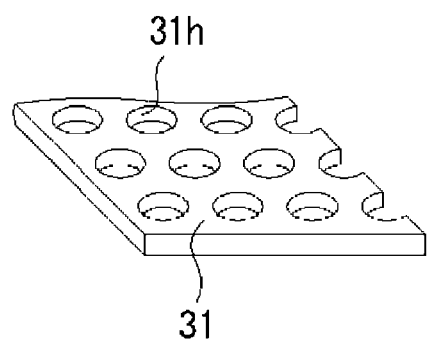
FIG. 20 is a perspective view of a gap adjusting member.
Figure 21:
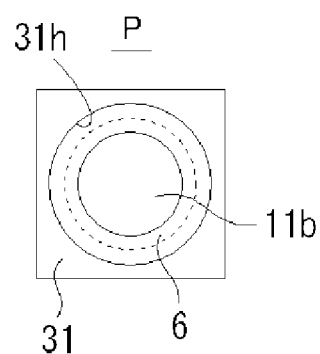
FIG. 21 is an enlarged view of a pixel of the light-receiving element array shown in FIG. 19.
Figure 22:
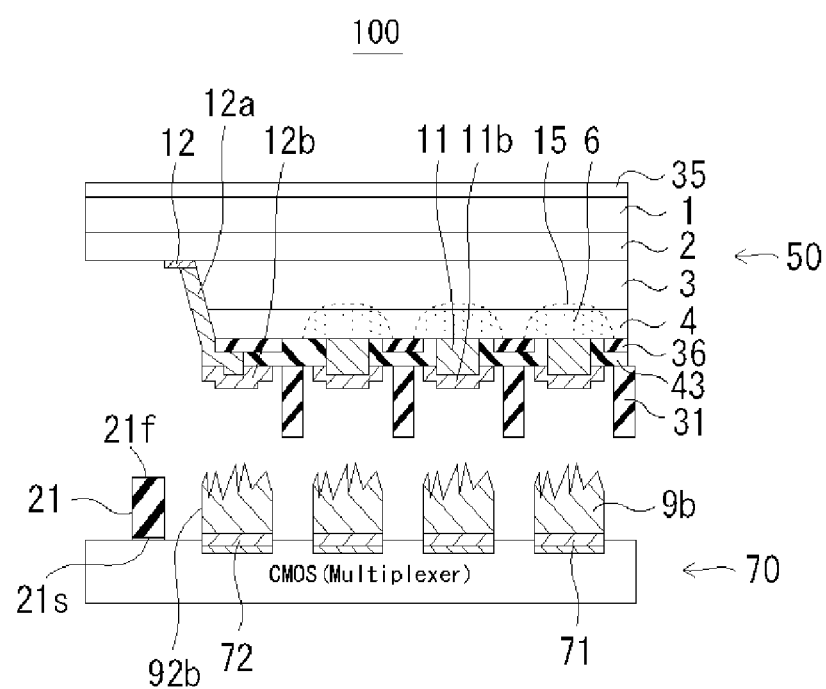
FIG. 22 is a drawing showing a state before a light-receiving element array and a multiplexer of the detection device shown in FIG. 18 are bonded together.

Type in which a Bump Height Adjusting Member has a Free End, a Gap Adjusting Member in a Reticular Pattern is Provided, and Bumps are Provided on Both Sides FIG. 18 is a sectional view showing a detection device 100 according to a sixth embodiment of the present invention. A gap adjusting member 31 is disposed between light-receiving elements so as to separate between the light-receiving elements (pixels). FIG. 19 is a plan view of a light-receiving element array 50 as viewed from the read-out circuit multiplexer 70 side. FIG. 20 is a perspective view of the gap adjusting member 31, and FIG. 21 is a plan view of a pixel P. FIG. 22 is a drawing showing a state before the light-receiving element array 50 and the read-out circuit multiplexer 70 are bonded together. The detection device 100 of this embodiment is characterized as follows.

(1) The gap adjusting member 31 has the pixel separating function to separate between adjacent pixels. Therefore, as shown in FIGS. 19 to 21, the gap adjusting member 31 includes a reticular-pattern member in which pixel holes 31h of a size including a portion corresponding to a p-type region 6 of pixel P are formed.

(2) As shown in FIG. 22, compressive shaping of bumps 9b and 92b using a bump height adjusting member 21 and a flat plate is performed on the read-out circuit multiplexer 70 side. Therefore, as described above, the ratio of defective pixels can be significantly decreased. However, by using the reticular pattern gap adjusting member 31 described above in (1), as a matter of course, the bumps 9b and 92b are securely separated from the adjacent bumps during bonding. As a result, short-circuiting between adjacent pixels can be more securely prevented, and thus the ratio of defective pixels can be significantly suppressed.

Seventh Embodiment

Figure 23:
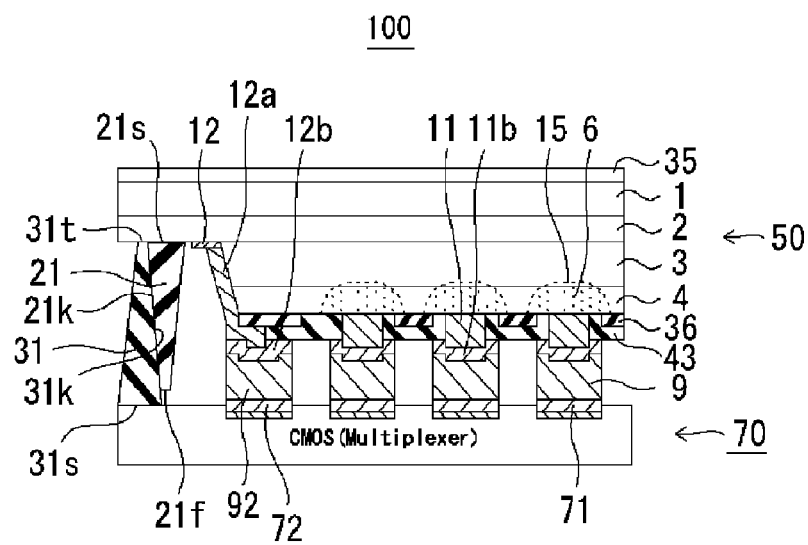
FIG. 23 is a sectional view showing a detection device according to a seventh embodiment of the present invention.
Figure 24:
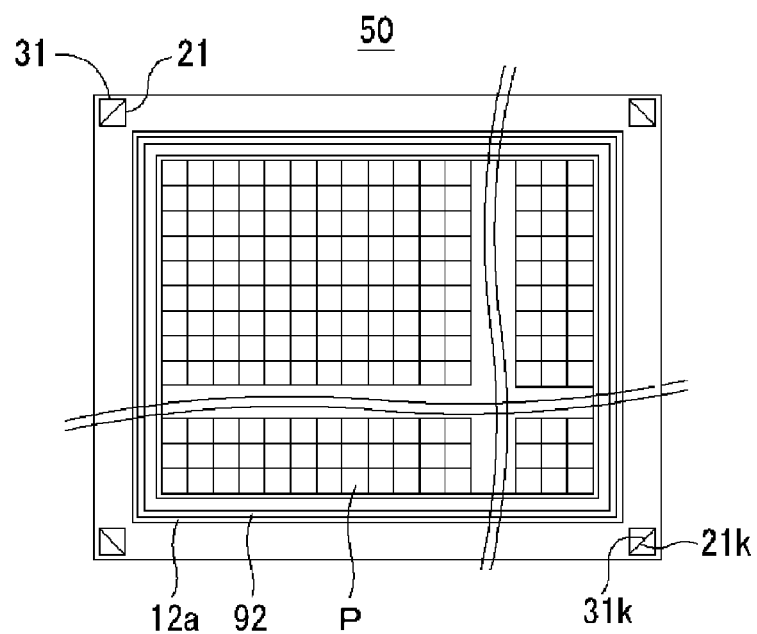
FIG. 24 is a plan view of a light-receiving element array of the detection device shown in FIG. 23 as viewed from the multiplexer side.

Type in which a Bump Height Adjusting Member and a Gap Adjusting Member are in Tapered Surface Contact, and Bumps are Provided on One Side FIG. 23 is a sectional view showing a detection device 100 according to a seventh embodiment of the present invention. FIG. 24 is a plan view of a light-receiving element array 50 including a bump height adjusting member 21 and a gap adjusting member 31, which come in contact with each other, as viewed from the read-out circuit multiplexer 70 side. The detection device 100 of this embodiment is characterized as follows.

(1) The gap adjusting member 31 and the bump height adjusting member 21 disposed at each of the four corners are provided with taper surfaces 31k and 21k, respectively. When the gap adjusting member 31 and the bump height adjusting member 21 come in contact with each other, the taper surfaces 31k and 21k come in contact with each other. Therefore, the function of positioning compound semiconductor layers in a planar direction (lateral direction) can be exhibited. As a result, in addition to the contribution of compressive shaping of the bumps 9b and 92b, lateral shift can be prevented by the taper surfaces 21k and 31k, thereby further stably decreasing the ratio of defective pixels.

Eighth Embodiment

Figure 25:
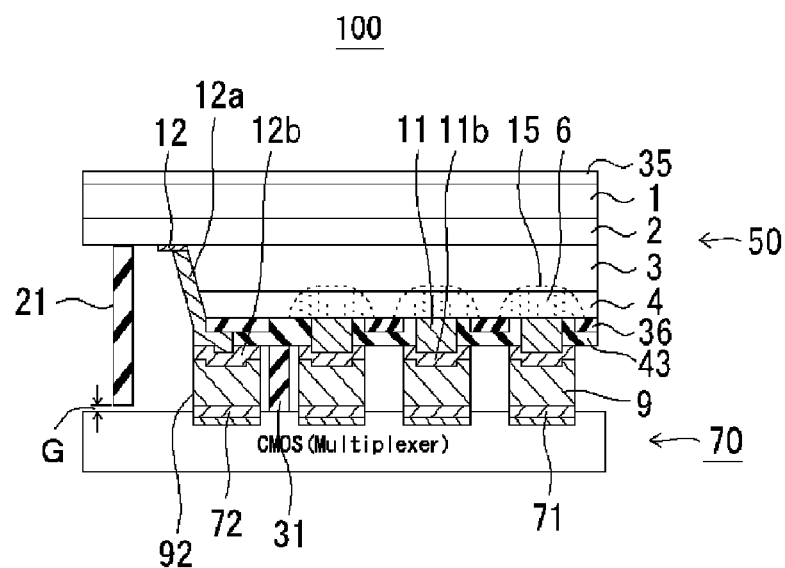
FIG. 25 is a sectional view showing a detection device according to an eighth embodiment of the present invention.
Figure 26:
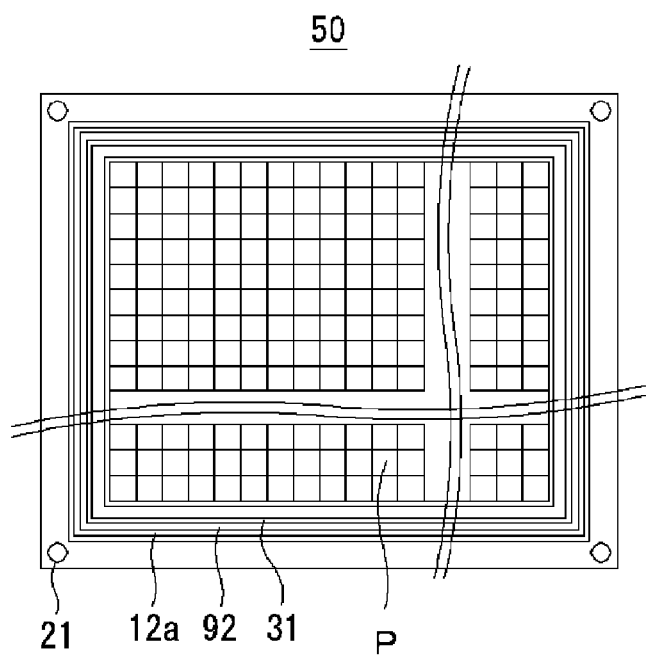
FIG. 26 is a plan view of a light-receiving element array of the detection device shown in FIG. 25 as viewed from the multiplexer side.

Type in which a Bump Height Adjusting Member has a Free End, an Electrode Gap Adjusting Member is Provided, and Bumps are Provided on One Side FIG. 25 is a sectional view showing a detection device 100 according to an eighth embodiment of the present invention. FIG. 26 is a plan view of a light-receiving element array 50 including a bump height adjusting member 21 and a gap adjusting member 31 as viewed from the read-out circuit multiplexer 70 side. The detection device 100 is characterized as follows.

(1) The gap adjusting member 31 is disposed between the bump 92 on the n-side electrode 12 side which supplies a common ground potential and the bumps 9 on the p-side electrode 11 side of light-receiving elements, not disposed in the peripheral portion of the light-receiving element array 50. Therefore, the bumps 92 on the common ground potential side can be separated from the bumps 9 in the pixel portions. As a result, short-circuiting between the bumps 9 of pixels P and the ground side can be securely prevented, and particularly defective pixels in the peripheral portion of a display screen can be removed.

EXAMPLE

Inspection of Defective Pixel

How much the number of defective pixels in a detection device of the present invention is decreased as compared with a conventional device was inspected by examples. The specimens used were the following two:

This Invention Example A1

The number of the pixels arranged was 320×256 (80,000 pixels), and the detection device according to the first embodiment was used.

Comparative Example B1

The number of the pixels arranged was the same, and the gap height adjusting member was omitted from the detection device according to the first embodiment.

Short-circuit defects were evaluated by forming an image under a condition in which light was not incident on the detection device. Pixels having short-circuit defects produce extremely large noise current as compared with good pixels, and thus charge is accumulated even in a dark state, thereby increasing a signal amount.

Open defects were evaluated by forming an image under a condition in which light was uniformly incident on all pixels through a light diffusion plate using a halogen lamp as a light source. In a pixel having good bonding between a light-receiving element array and a read-out circuit, a signal photoelectrically converted in a light-receiving element is transferred to the read-out circuit side, while in a pixel having open defect, a signal is not transferred.

Figure 27:
FIG. 27A is a drawing showing a display screen of this invention example A1 of the present invention in the case of a black background.
FIG. 27B is a drawing showing a display screen of this invention example A1 of the present invention in the case of a white background.
Figure 27:
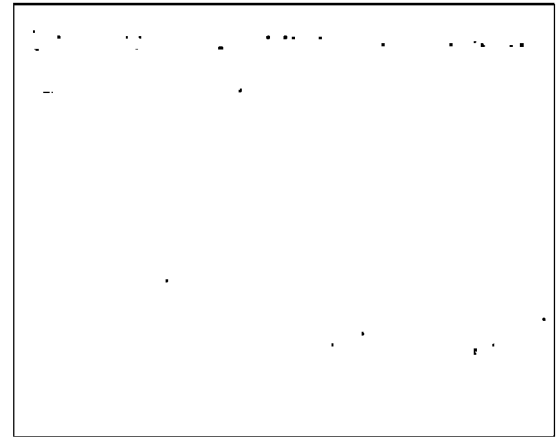
Figure 28:
FIG. 28A is a drawing showing a display screen of comparative example B1 of the present invention in the case of a black background.
FIG. 28B is a drawing showing a display screen of comparative example B1 of the present invention in the case of a white background.
Figure 28:
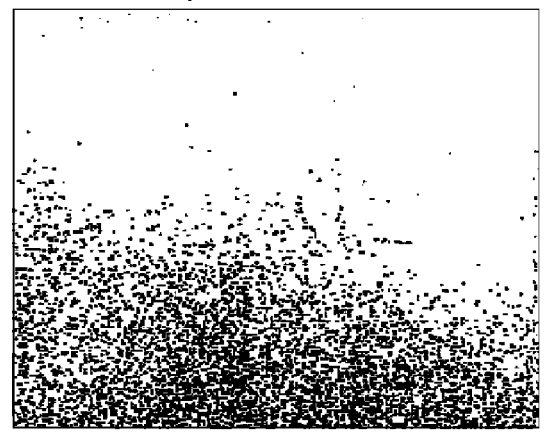

The results are shown in FIGS. 27A, 27B, 28A, and 28B. In each of the figures, a pixel with a large quantity of signal is shown in white, and pixel with a small quantity of signal is shown in black. FIG. 27A was obtained by imaging in a dark state in which light was not incident on the detection device, and thus a background is black as a whole. As described above, a pixel having short-circuit defect has a large signal amount and thus becomes white. FIG. 27B was obtained by imaging in a state in which light was incident on the detection device, and thus a background is white as a whole. As described above, a pixel having open defect has no signal transfer and thus becomes black. In Comparative example B1, as shown in FIGS. 28A and 28B, short-circuiting occurs over the entire surface. In addition, open defects are concentrated in a lower half of the screen. The ratio of defective pixels of Comparative example B1 was evaluated to 17%. On the other hand, in This invention example A1, as shown in FIGS. 27A and 27B, substantially neither short-circuit nor open was observed, and good results were obtained. The ratio of defective pixels of This invention example A1 was less than 1%, and thus the evaluation results were significantly good.

Although not specified above, the detection device is supposed to have an optical devices such as a lens, a diffraction grating, and the like, and also includes a mechanism for imaging an object to be imaged. Therefore, the detection device is frequently used as an imaging device. In addition, a semiconductor having photosensitivity in a near infrared range is a compound semiconductor and is weak against external force such as impact and the like, and thus the present invention can be preferably used. Compound semiconductors having photosensitivity in a near infrared range include not only the compound semiconductors of the type-II multiquantum well structure light-receiving layer described in the first embodiment but also GaInNAs, GaInNAsSb, and GaInNAsP which contain N.

Although embodiments and example of the present invention are described above, the embodiments and example of the present invention disclosed above are only examples, and the scope of the present invention is not limited to these embodiments. The scope of the present invention is defined by the claims and includes modifications having meanings equivalent to the claims and within the scope of the claims.

A detection device of the present invention is excellent in economy and capable of achieving high bonding yield while decreasing the ratio of defective pixels. Therefore, it is expected to contribute to the formation of clear images without temperature control or the like in a detection device using near infrared light which recently has attracted attention.

What is claimed is:

1. A detection device comprising:
a light-receiving element array formed on a compound semiconductor multilayer;
a read-out circuit which is formed on silicon and which reads out photocurrent from the light-receiving element array;
bonding bumps interposed between electrodes of the light-receiving element array and read-out electrodes of the read-out circuit; and
a bump height adjusting member fixed to at least one of the light-receiving element array and the read-out circuit and used for adjusting the height of the bumps before bonding,
wherein the end of the bump height adjusting member separates from the body of the other to which the bump height adjusting member is not fixed, and
wherein the bump height adjusting member is made of an insulator.

2. The detection device according to claim 1, wherein the bumps are made of In, AgSn, or AuSn, or such a material containing trace impurities or a conductive resin.

3. The detection device according to claim 1, wherein the compound semiconductor multilayer includes an InP substrate and a light-absorbing layer formed on the InP substrate and having a band gap wavelength of 1.6 μm to 3.0 μm; and
the light-absorbing layer is made of a type-II quantum well structure of GaAsSb/InGaAs, GaAsSb/InGaAsN, GaAsSb/InGaAsNP, or GaAsSb/InGaAsNSb, which has a lattice constant difference of 0.2% or less from the InP substrate.

4. The detection device according to claim 1, wherein the compound semiconductor multilayer includes an InP substrate and a light-absorbing layer formed on the InP substrate and having a band gap wavelength of 1.6 μm to 3.0 μm; and
the light-absorbing layer is made of InGaAs, GaInNAsP, GaInNAsSb, or GaInNAs, which has a lattice constant difference of 0.2% or less from the InP substrate.

5. A detection device comprising:
a light-receiving element array formed on a compound semiconductor multilayer;
a read-out circuit which is formed on silicon and which reads out photocurrent from the light-receiving element array;
bonding bumps interposed between electrodes of the light-receiving element array and read-out electrodes of the read-out circuit; and
a bump height adjusting member fixed to at least one of the light-receiving element array and the read-out circuit and used for adjusting the height of the bumps before bonding,
wherein the end of the bump height adjusting member separates from the body of the other to which the bump height adjusting member is not fixed, and
wherein the bump height adjusting member is made of polyimide.

6. A detection device comprising:
a light-receiving element array formed on a compound semiconductor multilayer;
a read-out circuit which is formed on silicon and which reads out photocurrent from the light-receiving element array;
bonding bumps interposed between electrodes of the light-receiving element array and read-out electrodes of the read-out circuit;
a bump height adjusting member fixed to at least one of the light-receiving element array and the read-out circuit and used for adjusting the height of the bumps before bonding; and
a gap adjusting member fixed to the light-receiving element array and/or the read-out circuit in order to adjust the gap between the light-receiving element array and the read-out circuit, wherein the end of the bump height adjusting member separates from the body of the other to which the bump height adjusting member is not fixed, and wherein the bump height adjusting member or the gap adjusting member is made of an insulator.

7. The detection device according to claim 6, wherein a taper surface is provided on each of the gap adjusting member and the bump height adjusting member so that the thickness decreases toward the tip; and wherein when the gap adjusting member comes in contact with (g2) the bump height adjusting member, the taper surfaces come in contact with each other.

8. The detection device according to claim 6, wherein the gap adjusting member is a member in a reticular pattern in which holes are disposed for the respective light-receiving element electrodes or read-out electrodes so that the bumps are surrounded by a non-hole portion.

9. The detection device according to claim 6, wherein the bumps are made of In, AgSn, or AuSn, or such a material containing trace impurities or a conductive resin.

10. The detection device according to claim 6, wherein the compound semiconductor multilayer includes an InP substrate and a light-absorbing layer formed on the InP substrate and having a band gap wavelength of 1.6 μm to 3.0 μm; and the light-absorbing layer is made of a type-II quantum well structure of GaAsSb/InGaAs, GaAsSb/InGaAsN, GaAsSb/InGaAsNP, or GaAsSb/InGaAsNSb, which has a lattice constant difference of 0.2% or less from the InP substrate.

11. The detection device according to claim 6, wherein the compound semiconductor multilayer includes an InP substrate and a light-absorbing layer formed on the InP substrate and having a band gap wavelength of 1.6 μm to 3.0 μm; and the light-absorbing layer is made of InGaAs, GaInNAsP, GaInNAsSb, or GaInNAs, which has a lattice constant difference of 0.2% or less from the InP substrate.

12. A detection device comprising:

a light-receiving element array formed on a compound semiconductor multilayer;

a read-out circuit which is formed on silicon and which reads out photocurrent from the light-receiving element array;

bonding bumps interposed between electrodes of the light-receiving element array and read-out electrodes of the read-out circuit;

a bump height adjusting member fixed to at least one of the light-receiving element array and the read-out circuit and used for adjusting the height of the bumps before bonding; and a gap adjusting member fixed to the light-receiving element array and/or the read-out circuit in order to adjust the gap between the light-receiving element array and the read-out circuit, wherein the end of the bump height adjusting member separates from the body of the other to which the bump height adjusting member is not fixed, and wherein the bump height adjusting member or the gap adjusting member is made of polyimide.

* * * * *